United States Patent [19]

Kreider

[11] Patent Number: 5,356,485
[45] Date of Patent: Oct. 18, 1994

[54] INTERMETALLIC THERMOCOUPLES

[75] Inventor: Kenneth G. Kreider, Potomac, Md.

[73] Assignee: The United States of America as represented by the Secretary of Commerce, Washington, D.C.

[21] Appl. No.: 875,391

[22] Filed: Apr. 29, 1992

[51] Int. Cl.$^5$ .............................................. H01L 35/16
[52] U.S. Cl. .................................. 136/225; 136/201; 136/238; 136/239; 136/240
[58] Field of Search ............... 136/225, 239, 240, 238, 136/201

[56] References Cited

U.S. PATENT DOCUMENTS

| | | | |
|---|---|---|---|
| 2,229,481 | 1/1941 | Telkes | 136/5 |
| 2,229,482 | 1/1941 | Telkes | 136/5 |
| 2,366,881 | 1/1945 | Telkes | 75/149 |
| 3,086,068 | 4/1963 | Charland et al. | 136/5 |
| 3,182,391 | 5/1965 | Charland et al. | 29/420.5 |
| 3,900,603 | 8/1975 | Rittmayer et al. | 427/124 |
| 3,983,076 | 9/1976 | Rockstad et al. | 252/518 |
| 4,144,147 | 3/1979 | Jarrett et al. | 204/129 |
| 4,350,994 | 9/1982 | Perepezko et al. | 357/67 |
| 4,494,136 | 1/1985 | Perepezko et al. | 357/67 |
| 4,500,741 | 2/1985 | Morimoto et al. | 136/206 |
| 4,543,320 | 9/1985 | Vijan | 430/314 |
| 4,572,841 | 2/1986 | Kaganowicz et al. | 427/39 |
| 4,576,829 | 3/1986 | Kaganowicz et al. | 427/39 |
| 4,772,370 | 9/1988 | Kreider | 204/192.15 |
| 4,795,660 | 1/1989 | Cooray et al. | 427/123 |
| 4,804,640 | 2/1989 | Kaganowicz et al. | 437/236 |
| 4,965,656 | 10/1990 | Kovbuchi et al. | 357/71 |
| 4,969,956 | 11/1990 | Kreider et al. | 136/201 |
| 5,032,568 | 7/1991 | Lau et al. | 505/1 |
| 5,068,050 | 11/1991 | Inomata et al. | 252/62.51 |

OTHER PUBLICATIONS

P. A. Kinzie, "Base Metal Thermocouples for Low and Moderate Temperature", *Thermocouple Temperature Measurement*, John Wiley, New York, pp. 135–137, 1973.

V. Das et al., "Temperature Variation of Thermoelectric Power of Vaccum Deposited PbSe Thin Films and Its Thickness Dependence", *Journal of Materials Science: Materials in Electronics*, 1990, pp. 169–174.

K. Kreider et al., "Sputter Deposition of Icosahedral Al-Mn and Al-Mn-Si", *Scripta Metallurgica*, vol. 21, pp. 657–662, 1987.

*Primary Examiner*—Donald P. Walsh
*Assistant Examiner*—Chrisman D. Carroll
*Attorney, Agent, or Firm*—James A. Oliff; Fran S. Wasserman

[57] ABSTRACT

An intermetallic film thermocouple has an amorphous phase and a Seebeck coefficient above 900 $\mu V/°$ C. Such thermocouples can be prepared by vapor-depositing an intermetallic and quenching the resulting intermetallic film.

29 Claims, 8 Drawing Sheets

INTERMETALLIC THERMOCOUPLES

FIELD OF THE INVENTION

The invention pertains to intermetallic thermocouples which generate high output voltages when subjected to temperature differentials. Such intermetallic thermocouples are useful in devices such as microcalorimeters, flow meters and general temperature measurement instruments.

BACKGROUND OF THE INVENTION

Thermocouples have been employed commercially for years as accurate temperature measurement sensors. Thermocouples are applicable over a wide range of temperatures (from −200° C. to 1800° C.) and are particularly useful for determining temperatures which extend far beyond the range of liquid-in-gas thermometers.

With the development of techniques for applying thin, thermocouple films, it was discovered that thin film thermocouples have several advantages over standard wire thermocouples for measuring solid surface temperatures.

Such advantages include 1) low mass, which leads to extremely rapid response; 2) thin film thickness, which does not affect the convective heat transfer characteristics of the surface compared to conventional wire sensors and 3) small size of the thermocouple films, which is quite compatible with intricate fabrication techniques in electronics applications. Such advantages have permitted adaptation of new thin film thermocouples to conventional, standard wire temperature sensing devices for use in molten metal fabrication, ceramic kilns, furnaces and interior hardware in gas turbine and internal combustion engines.

Conventional high output thermocouple devices have been constructed of bismuth-antimony intermetallics which have a voltage output (Seebeck coefficient) of 105 $\mu V/°$ C. (see, P. A. Kinzie, "Thermocouple Temperature Measurement," John Wiley, p. 135, New York, N.Y., 1973). Recent developments have focused on narrow-bandgap semiconductors such as lead-selenium, bismuth-tellurium and antimony-tellurium.

More contemporary applications of intermetallic thermocouples have attempted to make use of the thermoelectromotive force (Seebeck coefficient) of specific alloys in transforming thermal energy, particularly solar radiation, into electrical energy. In these applications, not only the Seebeck coefficient, but also the electric and thermal conductivities, are critical. The alloys first employed in solar electrical devices proved commercially impractical. Because the earliest predecessors to contemporary thermocouple alloys had low efficiencies and a lower ratio of electrical energy output obtained to the input of thermal energy, the use of such alloys in solar electric applications was limited to scientific and experimental use.

In an effort to overcome the limitations of the earlier alloys for use in solar electrical devices and the like, artisans attempted to develop thermocouple alloys having higher Seebeck coefficients. For example, U.S. Pat. No. 2,229,482 to Telkes discloses a zinc-antimonide thermocouple alloy having a Seebeck coefficient ranging from 114 $\mu V/°$ C. to 265 $\mu V/°$ C. Although these intermetallic, thermocouple compositions exhibited improved Seebeck coefficients over previously known alloys, the use of these compositions in advanced technology applications is limited due to their composition's still relatively low thermal conductivity.

U.S. Pat. No. 3,086,068 to Charland et al. discloses two processes used in preparing thermoelectric material: 1) single crystal growth and 2) casting. Several drawbacks of the thermoelectric materials exist. Namely, the single crystal growth is difficult and costly and the casting process produces polycrystalline materials having a coarse grain structure too brittle for commercial use.

Attempting to overcome these disclosed limitations, U.S. Pat. No. 3,086,068 to Charland et al. teaches a process for preparing antimony intermetallic thermoelectrics from powdered intermetallic materials by hot-pressing. The resulting thermoelectrics exhibit sufficient stability and much higher Seebeck coefficients than were previously available. Representative Seebeck coefficients range from 157.8 $\mu V/°$ C. to 210 $\mu V/°$ C. The disclosed intermetallics are limited to use in thermocouples not requiring higher Seebeck coefficients.

In an alternative process in U.S. Pat. No. 3,182,391 to Charland et al., a metal powder sintering process results in a zinc-antimonide thermoelectric material with a Seebeck coefficient of not more than 206 $\mu V/°$ C. As is true of previous zinc-antimonide systems, this Seebeck coefficient is still relatively small.

U.S. Pat. No. 3,900,603 to Rittmayer discloses low output thermoelectric generators having thermocouple legs of different conductance type. The disclosure discusses a method of vapor-depositing thermoelectric leg material upon a semiconductor carrier, and thereafter tempering to transform the amorphous phase of the thermoelectric semiconductor to a crystalline phase. The pre-tempered semiconductor has a Seebeck coefficient of 820 $\mu V/°$ C. and after heat treatment has a Seebeck coefficient of 146 $\mu V/°$ C. The disclosed pre-tempered semiconductors, although they possess relatively high Seebeck coefficients, have not been successful as a thermoelectric power material due to their high electrical resistivity (25–100 $\Omega \cdot$cm) Only after tempering when the Seebeck coefficient has effectively diminished to less than one fourth of its value in the amorphous phase, are the tempered semiconductors useful as thermocouples.

SUMMARY OF THE INVENTION

The present invention is directed to a thin film thermocouple which overcomes disadvantages heretofore inherent in conventional thermocouples. Specifically, the invention is directed to a thin film thermocouple comprising a thin film of an intermetallic system, the thermocouple having an amorphous phase and a Seebeck coefficient above 900 $\mu V/°$ C. Such thermocouples can be produced by physical vapor deposition with quenching to maintain the amorphous phase.

DETAILED DESCRIPTION OF PREFERRED EMBODIMENTS

A thin film thermocouple according to the present invention comprises a thin film of an intermetallic system and has an amorphous phase and a Seebeck coefficient above 900 $\mu V/°$ C.

Unique, thin film thermocouples with Seebeck coefficients two to three times the output of the best contemporary alloys can be prepared by freezing the intermetallic in an amorphous structure. One method for obtaining a thermocouple having the desired amorphous structure is by vapor depositing a thin film of the intermetallic on a substrate and rapidly cooling or quenching (almost instantaneously), to "freeze" the amorphous structure.

Figure 1:
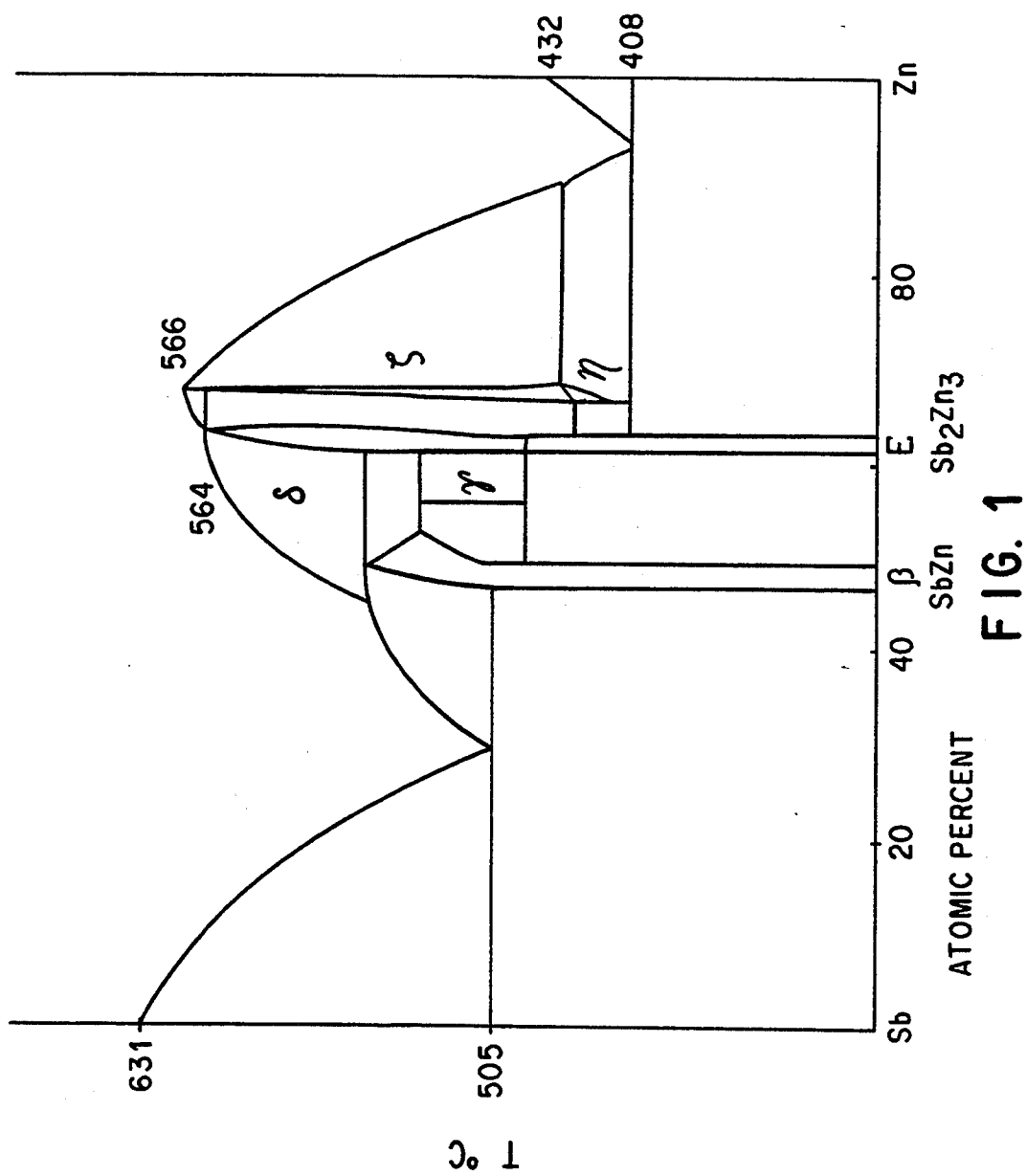
FIG. 1 is a phase diagram showing the complex structures possible at equilibrium in zinc-antimony intermetallic systems.

One intermetallic system particularly well suited to thin films according to the present invention, is the zinc-antimony system. FIG. 1 illustrates the complex structures possible at equilibrium in the zinc-antimony system, including $\alpha Zn$ $\alpha Sb$ $\beta SbZn$ and $\epsilon Sb_2Zn_3$, which are stable at room temperature, and $\gamma$, $\delta$, $\eta$, $\zeta$, which are stable at temperatures above 408° C. A vapor deposition process, used to create amorphous structures in other intermetallic systems, can be used to rapidly quench a non-crystalline, zinc-antimonide intermetallic film deposited on a substrate, in which the temperature of the substrate is maintained to effect the desired quenching rate and obtain the desired thin film having a high Seebeck coefficient. The very high quench rates according to the process of the invention can be achieved as single atoms are quenched to the temperature of the substrate as they are deposited on a growing thermocouple film.

Figure 2:
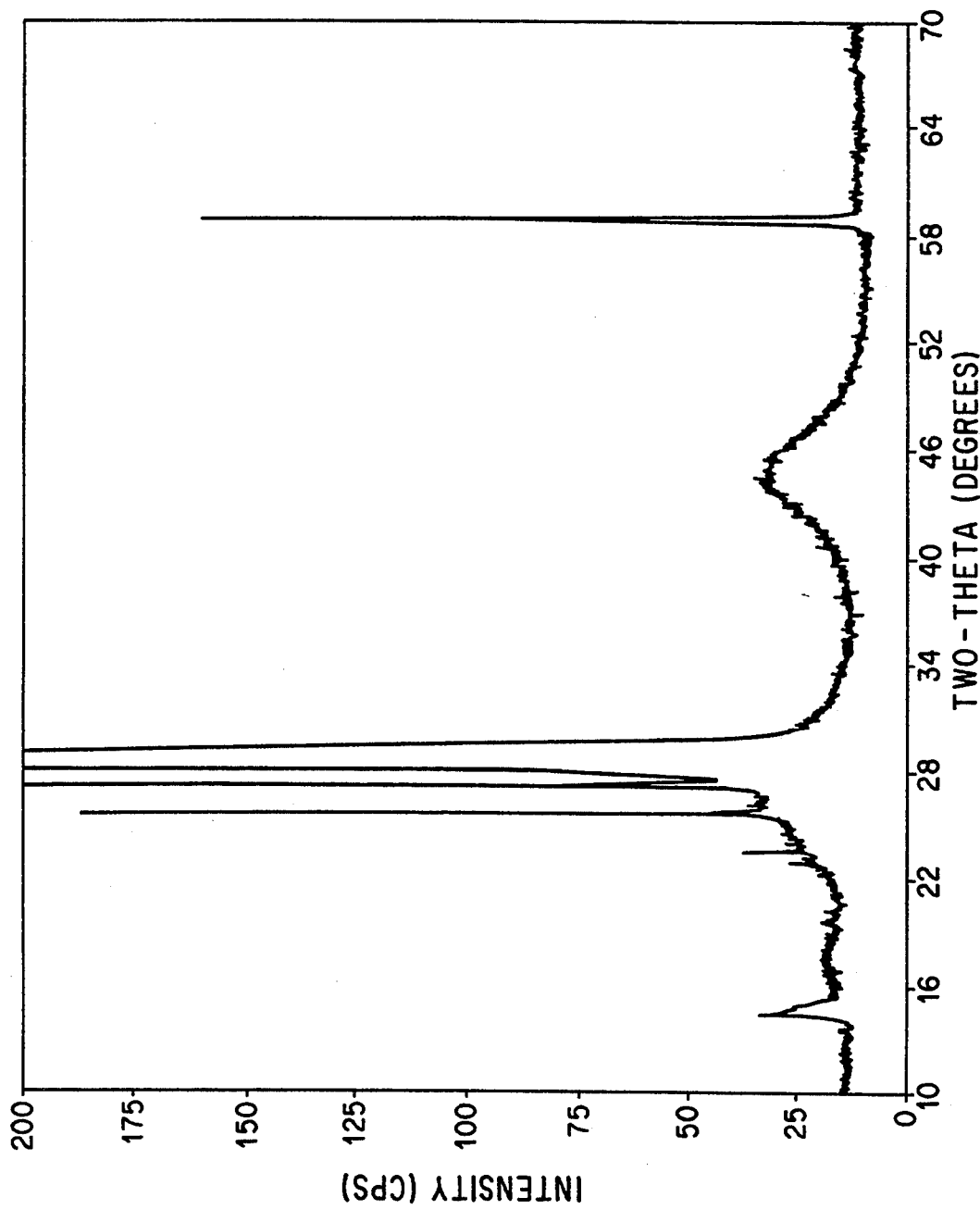
FIG. 2 is an X-ray diffraction pattern of a sputtered zinc-antimony intermetallic illustrating the existence of an amorphous zinc-antimony alloy.
Figure 3:
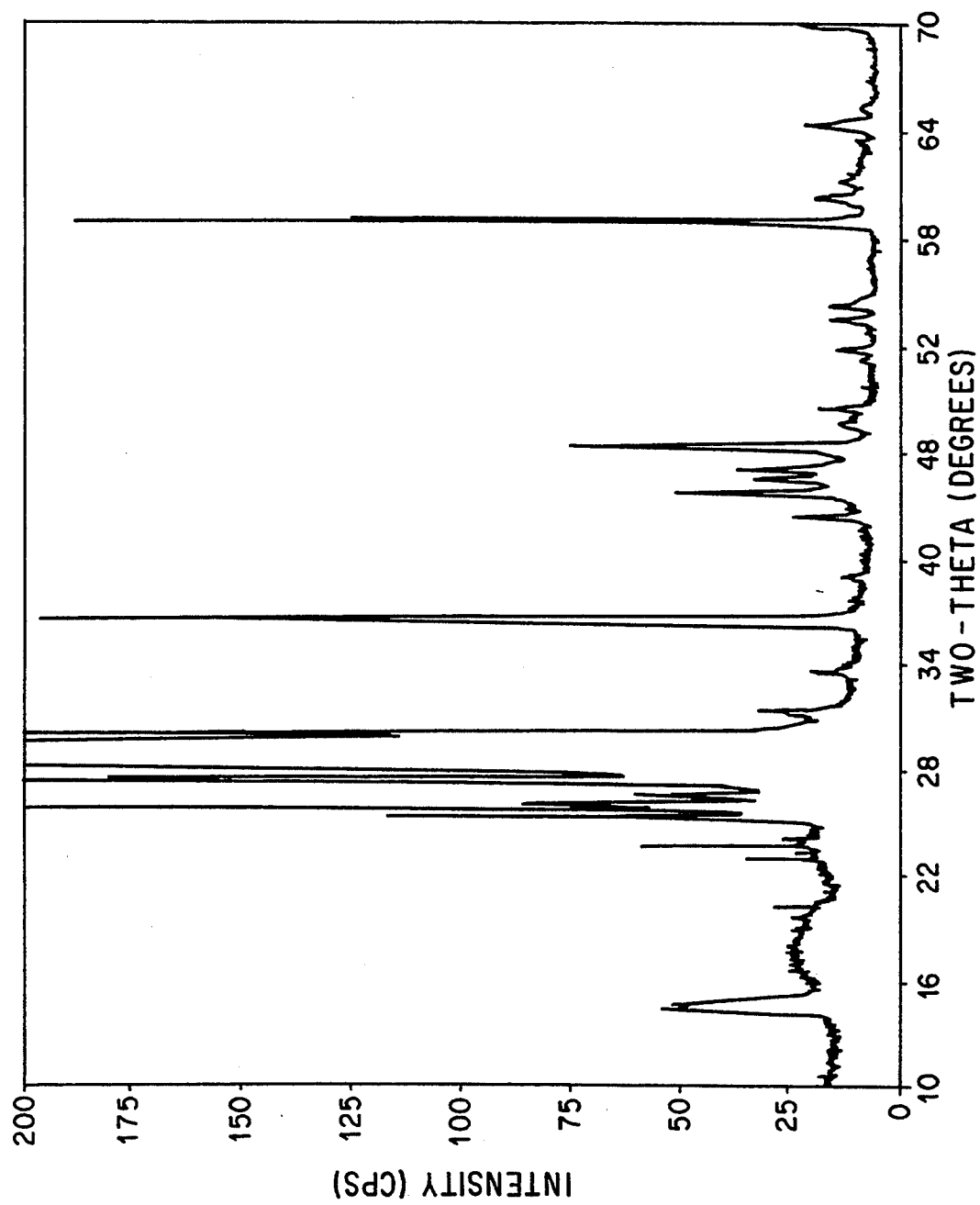
FIG. 3 is an X-ray diffraction pattern of a sputtered zinc-antimony intermetallic, subsequently annealed.

FIG. 2, an X-ray diffraction pattern of a zinc-antimonide film prepared using a sputtering process according to the invention, depicts the existence of the zinc-antimony amorphous structure, as indicated by the peaks at 27° and 45° 2$\theta$. The existence of the amorphous structure is further evidenced by a sputtered zinc-antimony thin film sample, prepared in accordance with the invention, and annealed at 320° C. Annealing recrystallizes the amorphous thin film into a thin film possessing a crystalline structure, as evidenced by the peaks appearing in the X-ray diffraction pattern of FIG. 3.

Although the exact crystalline pattern of the annealed zinc-antimony intermetallic is debated, crystallographers agree that a sample, recrystallized at 400° C. and having a crystalline pattern for zinc-antimony at 400° C. known to those of skill in the art (e.g. represented in: "Powder Diffraction File," Joint Committee on Powdered Diffraction Standards (JCPDS), American Society for Testing and Materials, (1974), Pennsylvania, No. 5-714), confirms the crystalline structure. Annealing not only crystallizes the amorphous, sputtered film but reduces the Seebeck coefficient by a factor of between 5 and 6.

Although the zinc-antimonide system is a preferred embodiment, other intermetallic systems are within the scope of the invention. Non-exhaustive, exemplary intermetallic systems useful in the present invention include indium-gallium-arsenic, indium-gallium-antimony, aluminum-gallium-phosphorus, gallium-indium-phosphorus, indium-aluminum-phosphorus, antimony-tellurium, cadmium-tinarsenic, tin-tellurium, lead-tellurium, tin oxide-antimony, tin oxide-zinc oxide and bismuth-tellurium.

Although amounts of the representative elements present in exemplary intermetallic systems useful in preparing thermocouples according to the invention may vary, in the preferred zinc-antimonide system, exemplary atomic percents include, but are not limited to, compositions in which zinc is present in an amount of from about 40 to about 60 atomic percent, preferably about 45–55 atomic percent, and more preferably about 50 atomic percent.

Exemplary Seebeck coefficients for increasing and decreasing temperatures for the zinc-antimonide thermocouples range between about 900 $\mu V/°$ C. and about 1100 $\mu V/°$ C., preferably between 940 $\mu V/°$ C. and 980 $\mu V/°$ C.

Thermocouple films function equivalently throughout the entire intermetallic film. Film thickness does not affect the convective heat transfer characteristics of the amorphous surface film. Therefore, the thickness of the intermetallic film is limited only by the characteristics and properties required of an article coated with the thermocouple film. Non-limiting, exemplary thicknesses of a thermocouple film possessing the characteristics of the present invention include thicknesses ranging from about 0.01 $\mu m$ to about 10 $\mu m$, and preferably ranges from about 1.1 $\mu m$ to about 4 $\mu m$, more preferably from about 1 $\mu m$ to about 2 $\mu m$.

In a process according to the invention, useful for preparing thin film intermetallics having an amorphous phase and a Seebeck coefficient above 900 $\mu V/°$ C., an intermetallic film is deposited on a substrate, such as an aluminum oxide or silicon wafer, by physical vapor deposition. While the key factor to be controlled lies in ensuring that the intermetallic is amorphous, other factors which are significant in achieving a thermocouple film according to the present invention are a distance from a target intermetallic to the substrate (target-substrate distance), a power density and a substrate temperature.

As the target intermetallic is vaporized and deposited on the substrate it is simultaneously quenched, preferably almost instantaneously, to the temperature of the substrate to fix the amorphous structure of the thermocouple. Annealing the amorphous thermocouple thin film, at an annealing temperature, recrystallizes the amorphous structure, and correspondingly reduces the Seebeck coefficient.

Figure 6:
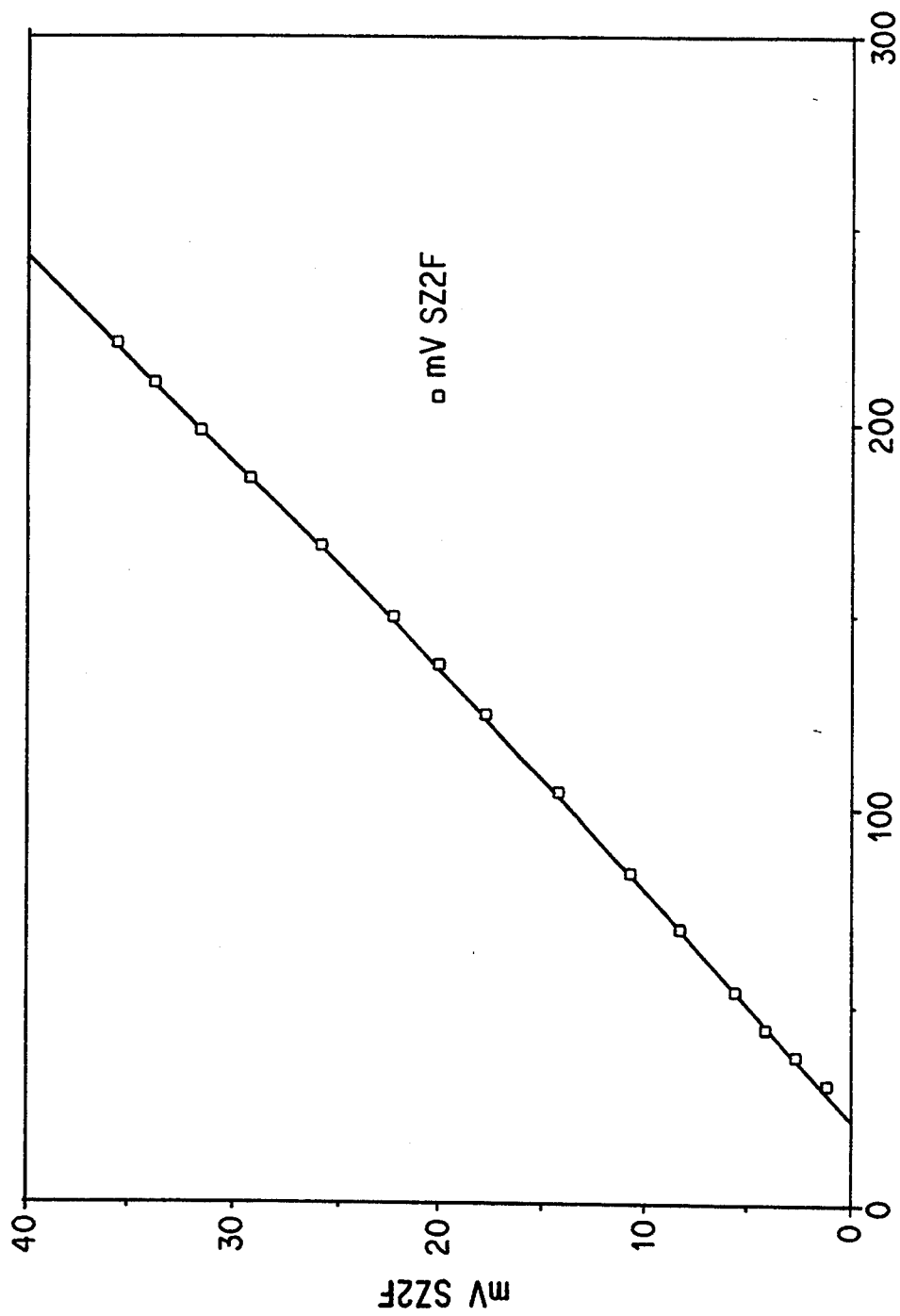
FIG. 6 is a coordinate graph of thermoelectric output as a function of increasing temperature of a sputtered zinc-antimony intermetallic, subsequently annealed at 320° C.
Figure 7:
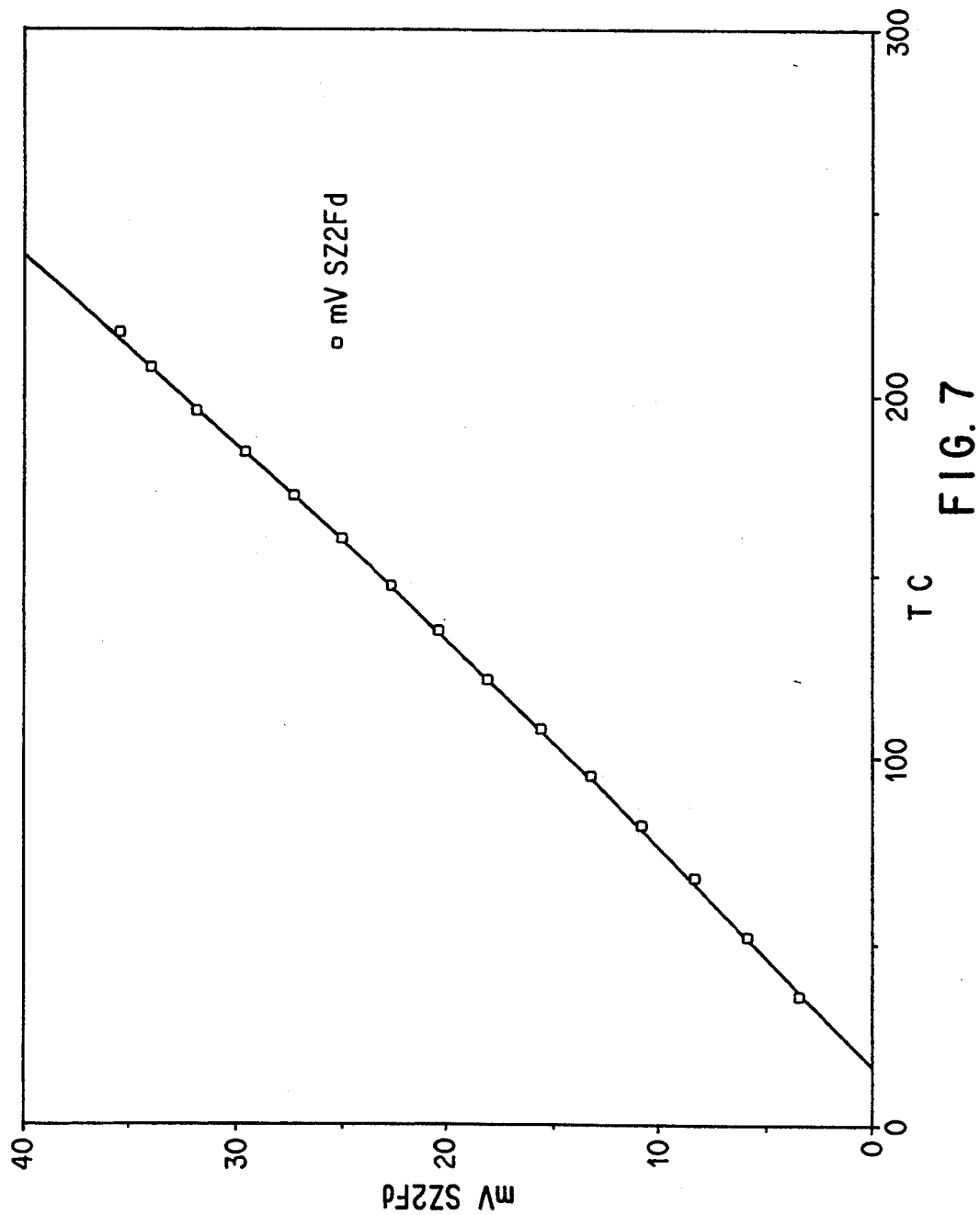
FIG. 7 is a coordinate graph of thermoelectric output as a function of decreasing temperature of a sputtered zinc-antimony intermetallic, subsequently annealed at 320° C.

Annealing temperatures include, but are not limited to, temperatures in the range of from about 300° C. to about 400° C. A coordinate graph of the thermoelectric output of a zinc-antimony thermocouple film, vapor deposited and subsequently annealed at 320° C., appears in FIG. 6. In FIG. 6, thermoelectric output is plotted against increasing temperature. Similarly, FIG. 7 is a coordinate graph of the thermoelectric output of a zinc-antimony thermocouple film, vapor deposited and subsequently annealed at 320° C. In FIG. 7, thermoelectric output is plotted against decreasing temperature.

Although quenching rates for films prepared in accordance with the invention may vary, non-limiting, exemplary quenching rates (which are approximately the quenching rate of a single atom) range from between about $10^{6°}$ C./second and about $10^{18°}$ C./second, preferably between about $10^{15}$ and $10^{17°}$ C./second.

An exemplary process for physical vapor deposition is carried out using a sputtering gas preferably argon.

The target-substrate distance and power density control the rate of deposition and growth of the intermetallic film. Target-substrate distances range, for example, from about 5 cm to about 14 cm, and preferably from about 10 cm to about 12 cm. Generally, in physical vapor deposition using a sputtering gas, the rate of deposition of the intermetallic film is inversely proportional to a square of the target-substrate distance.

Power density typically ranges, for example, from about 1 watt/cm$^2$ to about 20 watts/cm$^2$, preferably from about 14–16 watts/cm$^2$.

In sputter vapor deposition, exemplary sputtering gas pressures include, but are not limited to, pressures which range from about 0.03 Pa to about 3.0 Pa, preferably from about 0.1 Pa to about 2.0 Pa and more preferably from about 0.5 Pa.

In a sputtering gas vapor deposition process, a diffusion distance of individual atoms in the intermetallic film is controlled by a growth rate and the substrate temperature. Preferred growth rates range from about 1.0 $\mu$m per hour to 2.0 $\mu$m per hour, preferably about 1.2 $\mu$m per hour to about 1.7 $\mu$m per hour.

Generally, in order to achieve quenching rates suitable for preparing thermocouple films according to the present invention, the substrate temperature is not greater than 100° C. Preferably, the substrate temperature ranges from about 30° C. to about 80° C., and more preferably from about 50° C. to 70° C.

Other, non-limiting, physical vapor deposition techniques useful in the invention include: radio frequency, ion beam sputtering, electron beam deposition, laser ablation and thermal evaporation.

The invention will further be illustrated by the following non-limiting examples.

EXAMPLE 1

The positive leg of a thin film, zinc-antimony thermocouple is produced on an alumina (99.7% aluminum oxide) substrate 150 mm long by 10 mm wide and 0.5 mm thick. This substrate material is generally used for electronic circuitboards. The surface finish is 3 "micro inch" or 0.07 $\mu$m roughness factor. The substrate surface is cleaned with a 16% HCl hydrochloric acid wash. The cleaning is followed by a deionized water rinse and then the substrate is dry-baked at 200° C. Surface hydrocarbon and absorbed gas are removed by exposing the substrate surface for three minutes to an ultraviolet-ozone irradiation.

The substrate is placed in the sputtering chamber on a copper heat sink and maintained at a temperature between 40° C. and 50° C. to avoid formation of the crystalline phases. The chamber is evacuated to $10^{-4}$ Pa with an oil diffusion pump separated with a Meissner trap and 0.3 Pa argon (99.999%) is backfilled as the sputtering gas. A 5 cm planar magnetron is powered with 120 watts at 13.57 MHz using a zinc-antimony target having a 50% atomic fraction of zinc. The target to substrate distance is 12 cm. The thin film deposited was 1.5 $\mu$m thick after one hour and was tested for thermoelectric output.

Figure 8:
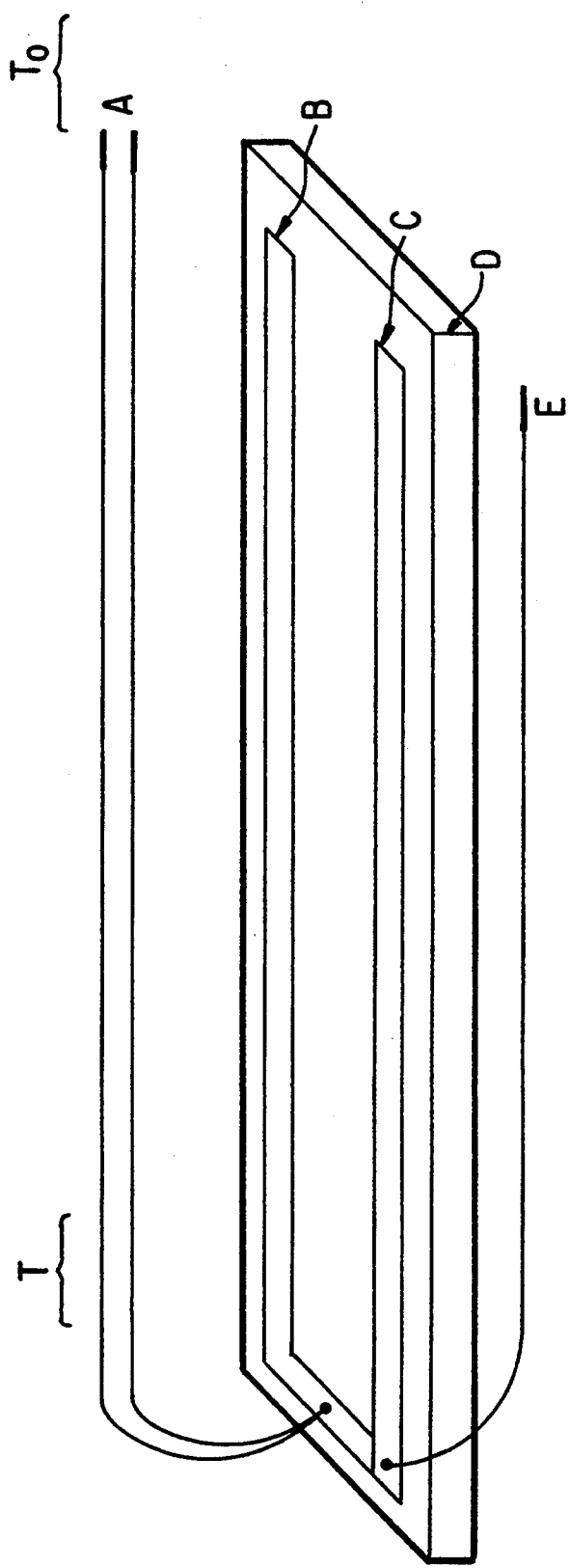
FIG. 8 is a thin film thermocouple test bar with a Type S thermocouple used for measuring Seebeck coefficients.

The Seebeck coefficients of the thin film thermocouple are measured by maintaining the reference junction wire of the thin film thermocouple at 20° C. ($T_0$) while heating and calibrating the measuring junction (T) with a Type S thermocouple. The zinc-antimony thermocouple voltage is measured opposite a pure platinum wire. FIG. 8 illustrates a typical reference Type S thermocouple constructed of a 0.5 $\mu$m aluminum oxide circuitboard D, having thin film thermocouple legs B and C and a platinum reference wire E. The thermocouple legs are 12 cm long and 2 mm wide.

Figure 4:
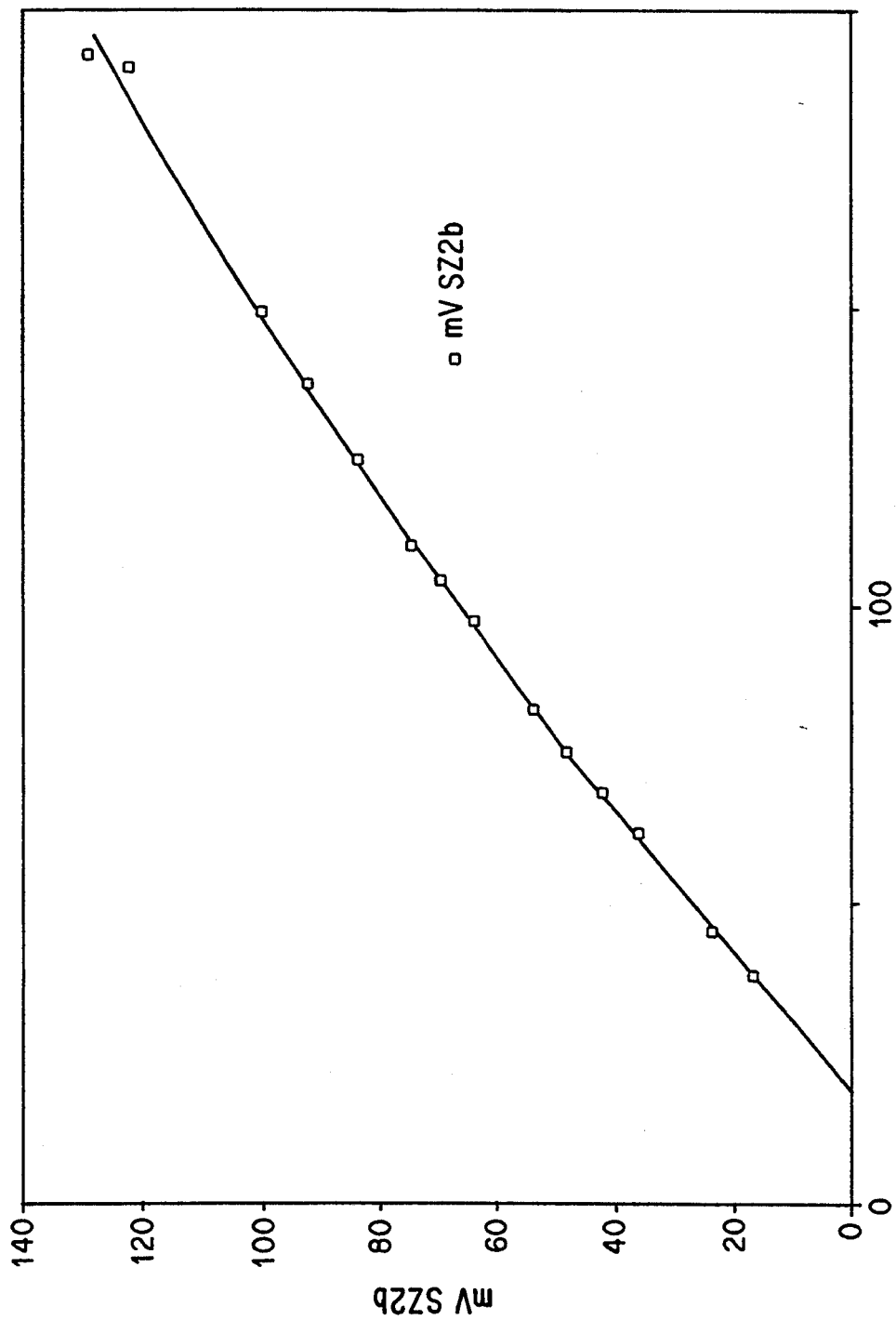
FIG. 4 is a coordinate graph of thermoelectric output as a function of increasing temperature of a sputtered zinc-antimony intermetallic.
Figure 5:
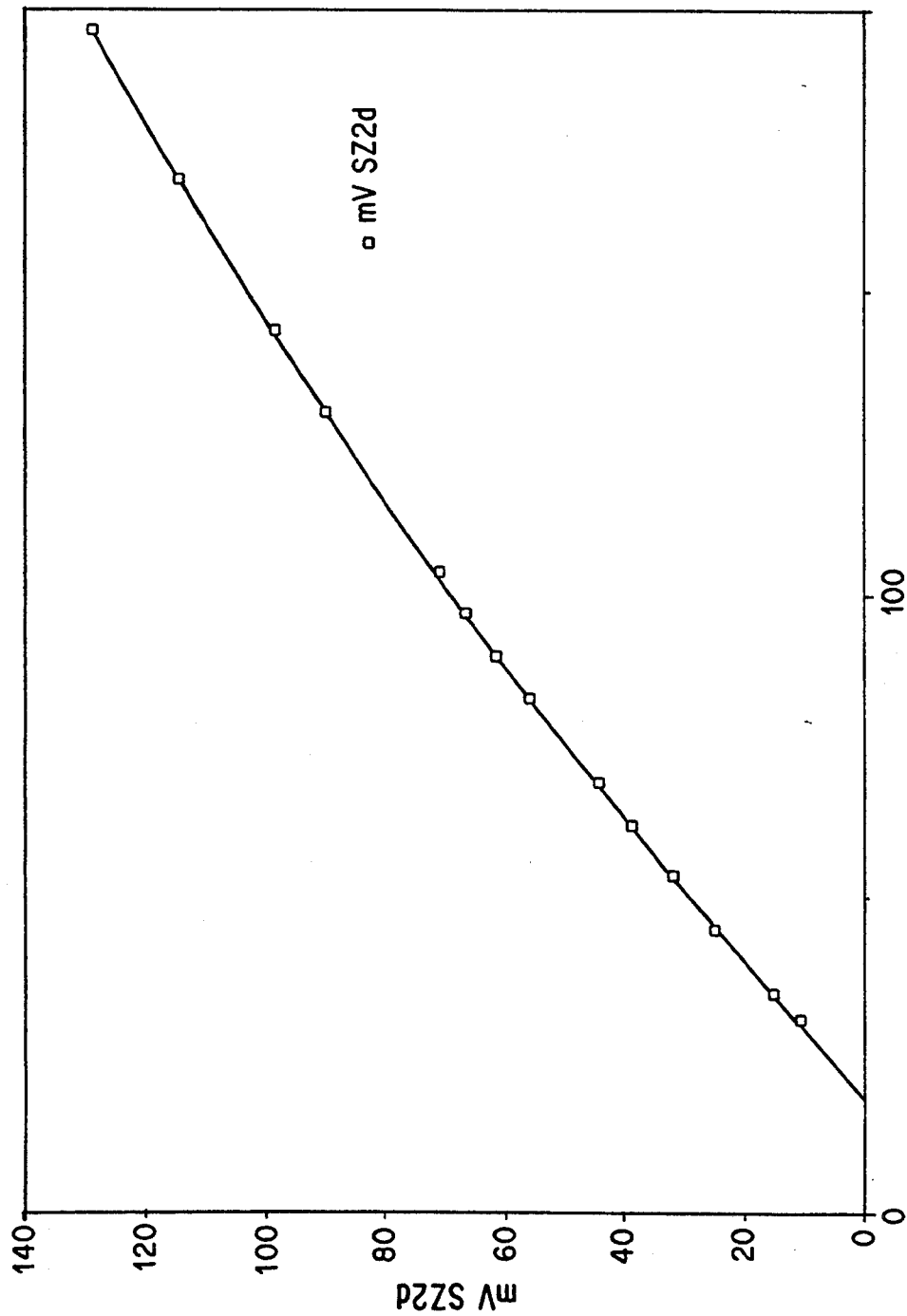
FIG. 5 is a coordinate graph of thermoelectric output as a function of decreasing temperature of a sputtered zinc-antimony intermetallic.

FIGS. 4 illustrates the thermoelectric output of the zinc-antimony film thus deposited for increasing temperature and FIG. 5 illustrates the thermoelectric output of the zinc-antimony film thus deposited for decreasing temperatures.

EXAMPLE 2

A zinc-antimony thermoelectric element on a [110]silicon wafer. The wafer is p doped to 25 $\Omega$·cm resistivity. Dimensions of the wafer are: 76 mm in diameter and 0.3 mm thick. The native SiO$_2$ is removed in a 10% HF dip followed by rinsing in deionized water and drying in a N$_2$ gas. The substrate is masked to form a 1 mm wide thermoelement and held on a cold (30°–40° C.) copper block for sputter deposition.

The sputtering chamber is evacuated to 0.05 $\mu$m pressure with a turbomolecular oil-free pump and backfilled with 0.5 Pa of Argon. Sputter deposition is accomplished using 470 volt and 0.4 amps in the cathode discharge of a 5 cm planar magnetron. The silicon substrate is maintained at 40° C. to ensure an amorphous deposit from the 50:50 atomic fraction zinc-antimony target. Target to substrate distance is 6 cm and a 0.5 $\mu$m thick film is deposited in 5 minutes.

The Seebeck coefficients of the thin film thermocouple thus deposited are measured as in Example 1.

What is claimed is:

1. A thin film thermocouple comprising two legs at least one of said legs having a thin film of an intermetallic system, said film having a fixed amorphous phase and a Seebeck coefficient above 900 $\mu$V/° C.

2. The thermocouple according to claim 1, wherein the intermetallic system is selected from the group consisting of indium-gallium-arsenic, indium-gallium-antimony, aluminum-gallium-phosphorus, gallium-indium-phosphorus, indium-aluminum-phosphorus, antimony-tellurium, cadmium-tin-arsenic, tin-tellurium, lead-tellurium, tin oxide-antimony, tin oxide-zinc oxide and bismuth-tellurium.

3. The thermocouple according to claim 1, wherein the intermetallic system is antimony-zinc.

4. The thermocouple according to claim 3, wherein zinc is present in an amount of from about 40 to about 60 atomic percent.

5. The thermocouple according to claim 3, wherein the amount of zinc is about 45–55 atomic percent.

6. The thermocouple according to claim 1, wherein the Seebeck coefficient for increasing and decreasing temperatures ranges from about 900 $\mu$V/° C. to about 1100 $\mu$V/° C.

7. The thermocouple according to claim 1, wherein the Seebeck coefficients for increasing and decreasing temperatures ranges from about 940 μV/° C. to about 980 μV/° C.

8. The thermocouple according to claim 1, wherein a thickness of said film ranges from about 0.01 μm to about 10.0 μm.

9. The thermocouple according to claim 1, wherein a thickness of said film ranges from about 1 μm to about 2 μm.

10. The thermocouple according to claim 1, wherein said film is produced by physical vapor deposition.

11. A method for preparing an intermetallic thin film thermocouple comprising two legs at least one of said leg having a film of an intermetallic system, said film having a fixed amorphous phase and a Seebeck coefficient above 900 μV/° C., comprising:
  a) sputtering depositing the intermetallic on a substrate; and
  b) quenching the itnermetallic to fix the amorphous structure of the thermocouple.

12. The method according to claim 11, wherein the intermetallic is quenched at a quenching rate between about $10^{16}$° C./second and about $10^{18}$° C./second.

13. The method according to claim 11, wherein the quenching rate is between $10^{15}$° and $10^{17}$° C./second.

14. The method according to claim 11, wherein the sputtering depositing is carried out using a sputtering gas.

15. The method according to claim 14, wherein the sputtering gas is argon.

16. The method according to claim 11, wherein the intermetallic is sputter deposited at a target-substrate distance from about 5 cm to about 14 cm.

17. The method according to claim 11, wherein the target-substrate distance is about 10–12 cm.

18. The method according to claim 11, wherein a rate of deposition of the intermetallic is inversely proportional to a square of a target-substrate distance.

19. The method according to claim 11, wherein the intermetallic is sputter deposited at a power density from about 1 watt/cm$^2$ to about 20 watts/cm$^2$.

20. The method according to claim 14, wherein the intermetallic is sputer deposited at a power density of about 14–16 watts/cm$^2$.

21. The method according to claim 14, wherein a pressure of the sputtering gas ranges from about 0.03 Pa to about 3.0 Pa.

22. The method according to claim 14, wherein the pressure of the sputtering gas is about 0.2–0.5 Pa.

23. The method according to claim 11, wherein a diffusion distance of individual atoms in the intermetallic film is controlled by growth rate of the intermetallic and temperature of the substrate.

24. The method according to claim 23, wherein the growth rate of the intermetallic ranges from about 1.0 μm per hour to about 2.0 μm per hour 25. The method according to claim 23, wherein the growth rate of the intermetallic film is about 1.2–1.7 μm per hour.

26. The method according to claim 23, wherein a temperature of the substrate is not greater than 100° C.

27. The method according to claim 23, wherein a substrate temperature ranges from about 30°–80° C.

28. The method according to claim 11, wherein the intermetallic is selected from the group consisting of indium-gallium-arsenic, indium-gallium-antimony, aluminum-gallium-phosphorus, gallium-indium-phosphorus, indium-aluminum-phosphorus, antimony-tellurium, cadmium-tin-arsenic, tin-tellurium, lead-tellurium, tin oxide-antimony, tin oxide-zinc oxide and bismuth-tellurium.

29. The method according to claim 11, wherein the intermetallic is antimony-zinc.

* * * * *